(12) United States Patent
Klein et al.

(10) Patent No.: US 7,100,954 B2
(45) Date of Patent: Sep. 5, 2006

(54) ULTRA-THIN WAFER HANDLING SYSTEM

(75) Inventors: Martin P. Klein, Bedford, MA (US);
Arthur Keigler, Wellesley, MA (US);
David Felsenthal, Marblehead, MA (US)

(73) Assignee: NEXX Systems, Inc., Billerica, MA (US)

( * ) Notice: Subject to any disclaimer, the term of this patent is extended or adjusted under 35 U.S.C. 154(b) by 282 days.

(21) Appl. No.: 10/618,091

(22) Filed: Jul. 11, 2003

(65) Prior Publication Data

US 2005/0110291 A1  May 26, 2005

(51) Int. Cl.
*B66C 1/02* (2006.01)

(52) U.S. Cl. .............................. 294/64.3; 414/222.01; 901/40

(58) Field of Classification Search ............... 274/64.3; 414/222.01, 744.8, 752.1, 941; 901/40
See application file for complete search history.

(56) References Cited

U.S. PATENT DOCUMENTS

| | | | |
|---|---|---|---|
| 2,744,859 A | 5/1956 | Rines |
| 3,317,410 A | 5/1967 | Croll et al. |
| 3,438,668 A | 4/1969 | Olsson et al. |
| 3,523,706 A | 8/1970 | Logue |
| 3,539,216 A | 11/1970 | Forcier |
| 3,652,442 A | 3/1972 | Powers et al. |
| 3,809,642 A | 5/1974 | Bond et al. |
| 3,902,615 A | 9/1975 | Levy et al. |
| 3,972,424 A | 8/1976 | Levy et al. |
| 4,002,254 A | 1/1977 | Olofsen |
| 4,008,815 A | 2/1977 | Fisk |
| 4,118,058 A | 10/1978 | Rahn et al. |
| 4,304,641 A | 12/1981 | Grandia et al. |
| 4,391,694 A | 7/1983 | Runsten |
| 4,405,435 A | 9/1983 | Tateishi et al. |
| 4,437,961 A | 3/1984 | Routh et al. |
| 4,526,670 A | 7/1985 | Hajj |
| 4,586,743 A | 5/1986 | Edwards et al. |
| 4,588,343 A | 5/1986 | Garrett |
| 4,668,365 A | 5/1987 | Foster et al. |
| 4,715,921 A | 12/1987 | Maher et al. |
| 4,747,928 A | 5/1988 | Takahashi et al. |
| 4,749,465 A | 6/1988 | Flint et al. |

(Continued)

FOREIGN PATENT DOCUMENTS

EP  0 492 114 A1  7/1992

(Continued)

OTHER PUBLICATIONS

"Automatic System for Single Wafer Reactive Ion Etching," IBM Technical Disclosure Bulletin, vol. 33, No. 2, Jul. 1990, pp. 239-242. (3 pages).

(Continued)

*Primary Examiner*—Donald Underwood
(74) *Attorney, Agent, or Firm*—Proskauer Rose LLP

(57) ABSTRACT

An improved Bernoulli end effector for holding, handling, and transporting ultra-thin substrates includes edge guides to aid in the positioning of the substrate and may include friction pads that impede motion of the substrate lifted by the end effector. The Bernoulli end effector may be incorporated into an apparatus and method for supinating a substrate so that both surfaces of the substrate can be processed. In addition, the Bernoulli end effector may be used to place ultra-thin substrates on and retrieve substrates from a substrate handling structure that includes weights that prevent the substrates from bowing or flexing during processing and includes guides that prevent the ultra-thin substrates from moving or translating on the surface of the substrate handling structure.

37 Claims, 7 Drawing Sheets

U.S. PATENT DOCUMENTS

| | | |
|---|---|---|
| 4,785,962 A | 11/1988 | Toshima |
| 4,819,167 A | 4/1989 | Cheng et al. |
| 4,820,396 A | 4/1989 | de Masi |
| 4,842,683 A | 6/1989 | Cheng et al. |
| 4,872,947 A | 10/1989 | Wang et al. |
| 4,892,753 A | 1/1990 | Wang et al. |
| 4,911,597 A | 3/1990 | Maydan et al. |
| 4,951,601 A | 8/1990 | Maydan et al. |
| 4,962,441 A | 10/1990 | Collins |
| 5,000,113 A | 3/1991 | Wang et al. |
| 5,000,827 A | 3/1991 | Schuster et al. |
| 5,013,385 A | 5/1991 | Maher et al. |
| 5,046,909 A | 9/1991 | Murdoch |
| 5,080,549 A | 1/1992 | Goodwin et al. |
| 5,102,495 A | 4/1992 | Maher et al. |
| 5,110,249 A | 5/1992 | Norman |
| 5,117,121 A | 5/1992 | Watanabe et al. |
| 5,143,593 A | 9/1992 | Ueno et al. |
| 5,198,089 A | 3/1993 | Brueggman |
| 5,199,483 A | 4/1993 | Bahng |
| 5,200,049 A | 4/1993 | Stevenson et al. |
| 5,215,619 A | 6/1993 | Cheng et al. |
| 5,224,809 A | 7/1993 | Maydan et al. |
| 5,227,708 A | 7/1993 | Lowrance |
| 5,242,043 A | 9/1993 | Sturm |
| 5,269,643 A | 12/1993 | Kodama et al. |
| 5,280,983 A | 1/1994 | Maydan et al. |
| 5,292,393 A | 3/1994 | Maydan et al. |
| 5,308,431 A | 5/1994 | Maher et al. |
| 5,315,473 A | 5/1994 | Collins et al. |
| 5,324,155 A | 6/1994 | Goodwin et al. |
| 5,330,301 A | 7/1994 | Brancher |
| 5,344,542 A | 9/1994 | Maher et al. |
| 5,345,999 A | 9/1994 | Hosokawa |
| 5,354,715 A | 10/1994 | Wang et al. |
| 5,355,066 A | 10/1994 | Lowrance |
| 5,360,996 A | 11/1994 | Nulman et al. |
| 5,362,526 A | 11/1994 | Wang et al. |
| 5,363,872 A | 11/1994 | Lorimer |
| 5,370,709 A | 12/1994 | Kobayashi |
| 5,371,042 A | 12/1994 | Ong |
| 5,377,816 A | 1/1995 | Deligi et al. |
| 5,387,067 A | 2/1995 | Grunes |
| 5,391,035 A | 2/1995 | Krueger |
| 5,399,387 A | 3/1995 | Law et al. |
| 5,421,987 A | 6/1995 | Tzanavaras et al. |
| 5,425,611 A | 6/1995 | Hughes et al. |
| 5,427,666 A | 6/1995 | Mueller et al. |
| 5,443,995 A | 8/1995 | Nulman |
| 5,444,597 A | 8/1995 | Blake et al. |
| 5,447,409 A | 9/1995 | Grunes et al. |
| 5,460,689 A | 10/1995 | Raaijmakers et al. |
| 5,469,035 A | 11/1995 | Lowrance |
| 5,492,566 A | 2/1996 | Sumnitsch |
| 5,512,320 A | 4/1996 | Turner et al. |
| 5,513,668 A | 5/1996 | Sumnitsch |
| 5,514,258 A | 5/1996 | Brinket et al. |
| 5,516,412 A | 5/1996 | Andricacos et al. |
| 5,521,120 A | 5/1996 | Nulman et al. |
| 5,527,605 A | 6/1996 | Doessel et al. |
| 5,534,231 A | 7/1996 | Savas |
| 5,538,390 A | 7/1996 | Salzman |
| 5,556,147 A | 9/1996 | Somekh et al. |
| 5,556,248 A | 9/1996 | Grunes |
| 5,563,798 A | 10/1996 | Berken et al. |
| 5,566,744 A | 10/1996 | Tepman |
| 5,570,994 A | 11/1996 | Somekh et al. |
| 5,579,718 A | 12/1996 | Freerks |
| 5,597,460 A | 1/1997 | Reynolds |
| 5,607,009 A | 3/1997 | Turner et al. |
| 5,607,776 A | 3/1997 | Mueller et al. |
| 5,618,338 A | 4/1997 | Kurabayashi et al. |
| 5,618,388 A | 4/1997 | Seeser et al. |
| 5,630,690 A | 5/1997 | Salzman |
| 5,630,916 A | 5/1997 | Gerrish et al. |
| 5,630,917 A | 5/1997 | Guo |
| 5,636,964 A | 6/1997 | Somekh et al. |
| 5,643,366 A | 7/1997 | Somekh et al. |
| 5,643,427 A | 7/1997 | Kobayashi et al. |
| 5,656,139 A | 8/1997 | Carey et al. |
| 5,656,902 A | 8/1997 | Lowrance |
| 5,658,442 A | 8/1997 | Van Gogh et al. |
| 5,661,913 A | 9/1997 | Kato et al. |
| 5,674,786 A | 10/1997 | Turner et al. |
| 5,678,980 A | 10/1997 | Grunes et al. |
| 5,683,564 A | 11/1997 | Reynolds |
| 5,697,427 A | 12/1997 | Ngan et al. |
| 5,697,748 A | 12/1997 | Somekh et al. |
| 5,697,750 A | 12/1997 | Fishkin et al. |
| 5,730,801 A | 3/1998 | Tepman et al. |
| 5,740,062 A | 4/1998 | Berken et al. |
| 5,746,460 A | 5/1998 | Marohl et al. |
| 5,746,897 A | 5/1998 | Heimanson et al. |
| 5,747,360 A | 5/1998 | Nulman |
| 5,764,012 A | 6/1998 | Lowrance |
| 5,780,357 A | 7/1998 | Xu et al. |
| 5,784,238 A | 7/1998 | Nering et al. |
| 5,788,453 A | 8/1998 | Donde et al. |
| 5,788,799 A | 8/1998 | Steger et al. |
| 5,789,878 A | 8/1998 | Kroeker et al. |
| 5,795,355 A | 8/1998 | Moran |
| 5,799,860 A | 9/1998 | Demaray et al. |
| 5,803,977 A | 9/1998 | Tepman et al. |
| 5,810,937 A | 9/1998 | Gupta et al. |
| 5,822,171 A | 10/1998 | Shamouilian et al. |
| 5,824,197 A | 10/1998 | Tanaka |
| 5,833,426 A | 11/1998 | Marohl |
| 5,836,736 A | 11/1998 | Thompson et al. |
| 5,838,121 A | 11/1998 | Fairbairn et al. |
| 5,843,296 A | 12/1998 | Greenspan |
| 5,844,195 A | 12/1998 | Fairbairn et al. |
| 5,846,883 A | 12/1998 | Moslehi |
| 5,851,602 A | 12/1998 | Law et al. |
| 5,855,681 A | 1/1999 | Maydan et al. |
| 5,861,086 A | 1/1999 | Khurana et al. |
| 5,861,197 A | 1/1999 | Law et al. |
| 5,865,894 A | 2/1999 | Reynolds |
| 5,871,588 A | 2/1999 | Moslehi et al. |
| 5,871,811 A | 2/1999 | Wang et al. |
| 5,877,086 A | 3/1999 | Aruga |
| 5,879,127 A | 3/1999 | Grunes et al. |
| 5,882,165 A | 3/1999 | Maydan et al. |
| 5,882,168 A | 3/1999 | Thompson et al. |
| 5,893,966 A | 4/1999 | Akram et al. |
| 5,896,877 A | 4/1999 | Pirker |
| 5,905,302 A | 5/1999 | Lane et al. |
| 5,932,077 A | 8/1999 | Reynolds |
| 5,935,330 A | 8/1999 | Taniguchi |
| 5,967,578 A | 10/1999 | Frey |
| 5,996,241 A | 12/1999 | Thompson et al. |
| 6,017,437 A | 1/2000 | Ting et al. |
| 6,022,417 A | 2/2000 | Sumnitsch |
| 6,022,465 A | 2/2000 | Ting et al. |
| 6,024,526 A | 2/2000 | Slocum et al. |
| 6,027,631 A | 2/2000 | Broadbent |
| 6,033,540 A | 3/2000 | Kosaki et al. |
| 6,048,154 A | 4/2000 | Wytman |
| 6,074,544 A | 6/2000 | Reid et al. |
| 6,082,950 A | 7/2000 | Altwood et al. |
| 6,095,582 A * | 8/2000 | Siniaguine et al. ........ 294/64.3 |
| 6,099,702 A | 8/2000 | Reid et al. |
| 6,099,712 A | 8/2000 | Ritzdorf et al. |
| 6,103,085 A | 8/2000 | Woo et al. |
| 6,103,628 A | 8/2000 | Talieh |

| | | |
|---|---|---|
| 6,139,695 A | 10/2000 | Washburn et al. |
| 6,139,703 A | 10/2000 | Hanson et al. |
| 6,139,712 A | 10/2000 | Patton et al. |
| 6,152,507 A | 11/2000 | Pirker |
| 6,156,167 A | 12/2000 | Patton et al. |
| 6,159,354 A | 12/2000 | Contolini et al. |
| 6,162,344 A | 12/2000 | Reid et al. |
| 6,167,893 B1 | 1/2001 | Taatjes et al. |
| 6,174,011 B1 | 1/2001 | Keigler |
| 6,179,983 B1 | 1/2001 | Reid et al. |
| 6,193,859 B1 | 2/2001 | Contolini et al. |
| 6,197,181 B1 | 3/2001 | Chen |
| 6,198,616 B1 | 3/2001 | Dahimene et al. |
| 6,214,193 B1 | 4/2001 | Reid et al. |
| 6,215,321 B1 | 4/2001 | Nakata |
| 6,217,272 B1 | 4/2001 | Felsenthal et al. |
| 6,224,670 B1 | 5/2001 | Ishida |
| 6,228,232 B1 | 5/2001 | Woodruff et al. |
| 6,228,233 B1 | 5/2001 | Lakshmikanthan et al. |
| 6,234,788 B1 | 5/2001 | Lee |
| 6,236,555 B1 | 5/2001 | Leeser |
| 6,243,251 B1 | 6/2001 | Kanno et al. |
| 6,254,328 B1 | 7/2001 | Wytman |
| 6,254,742 B1 | 7/2001 | Hanson et al. |
| 6,254,760 B1 | 7/2001 | Shen et al. |
| 6,258,220 B1 | 7/2001 | Dordi et al. |
| 6,258,223 B1 | 7/2001 | Cheung et al. |
| 6,260,894 B1 | 7/2001 | Minnick et al. |
| 6,307,728 B1 | 10/2001 | Leeser |
| 6,328,858 B1 | 12/2001 | Felsenthal et al. |
| 6,396,024 B1 | 5/2002 | Doughty et al. |
| 6,430,468 B1 | 8/2002 | Tepman et al. |
| 6,530,733 B1 | 3/2003 | Klein et al. |
| 6,550,158 B1 | 4/2003 | Doley et al. |
| 6,682,288 B1 | 1/2004 | Klein et al. |
| 6,746,565 B1 | 6/2004 | Bleck et al. |
| 6,749,391 B1 | 6/2004 | Woodruff et al. |
| 2002/0140148 A1 | 10/2002 | Aigner et al. |
| 2004/0012214 A1* | 1/2004 | Casarotti et al. ........... 294/64.3 |

FOREIGN PATENT DOCUMENTS

| | | |
|---|---|---|
| GB | 2 171 119 A | 8/1986 |
| JP | 63024632 | 2/1988 |
| JP | 64004472 | 1/1989 |
| JP | 01123068 | 5/1989 |
| JP | 01309961 | 12/1989 |
| JP | 03094070 | 4/1991 |
| JP | 03227536 | 8/1991 |
| JP | 05171432 | 7/1993 |
| JP | 053397923 | 12/1993 |
| JP | 06063885 | 3/1994 |
| JP | 06184741 | 7/1994 |

OTHER PUBLICATIONS

Gaulhofer et al., "Wafer Thinning and Strength Enhancement to Meet Emergency Packaging Requirements," IEMT Europe 2000 Symposium (IEEE/CPMT), Apr. 6-7, 2000, Munich, Germany, Semicon Europe, pp. 21-27.

Haller et al., "High Frequency Performance of GE High Density Interconnect Modules," IEEE Transactions on Components, Hybrids, and Manufacturing Technology, vol. 16, No. 1, Feb. 15, 1993, pp. 1-5.

Hendrix et al., "Improvements in Yield by Eliminating Backgrind Defects and Providing Stress Relief with Wet Chemical Etching," http://www.hologenix.com/Articlel.htm, printed Jun. 30, 2003, 6 pages.

Young et al., "Thermal Modeling and Mechanical Analysis of Very Thin Silicon Chips for Conformal Electronic Systems," University of Arkansas, Fayetteville, AZ, 8 pages.

* cited by examiner

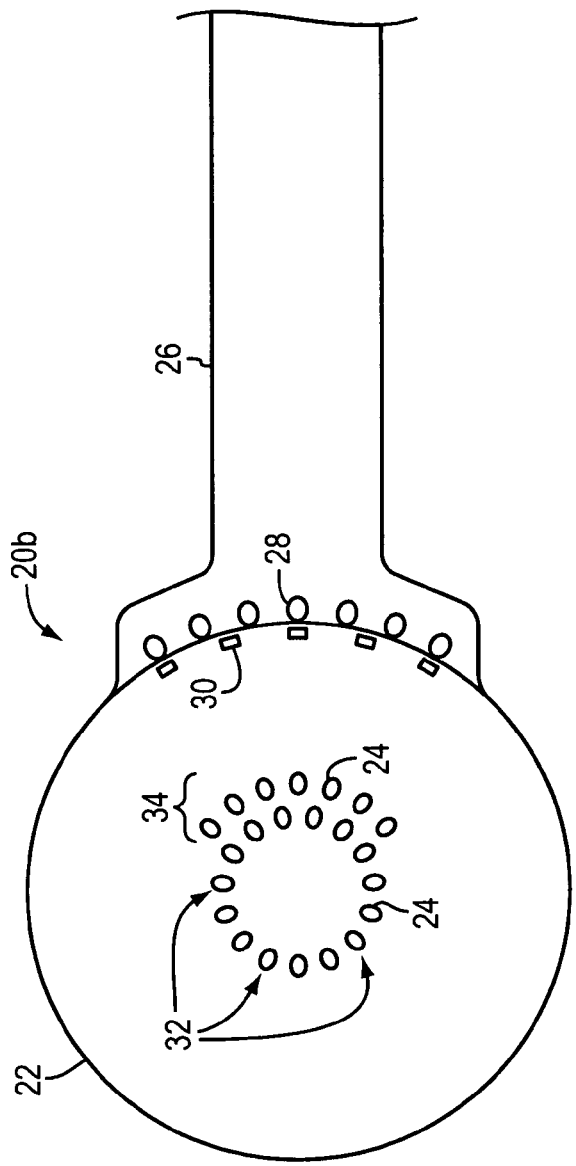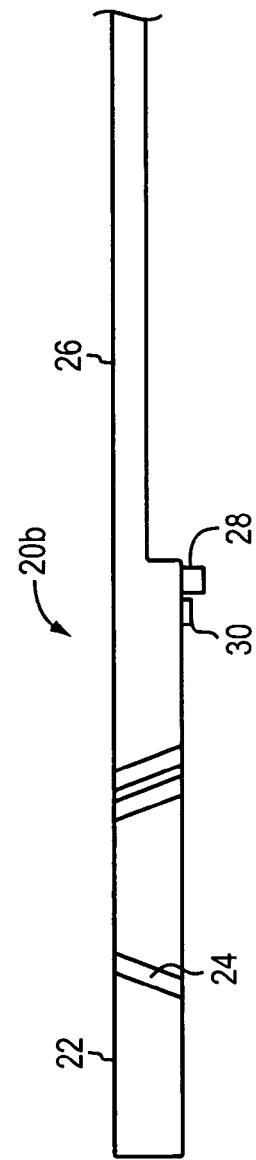
FIG. 2A
FIG. 2B

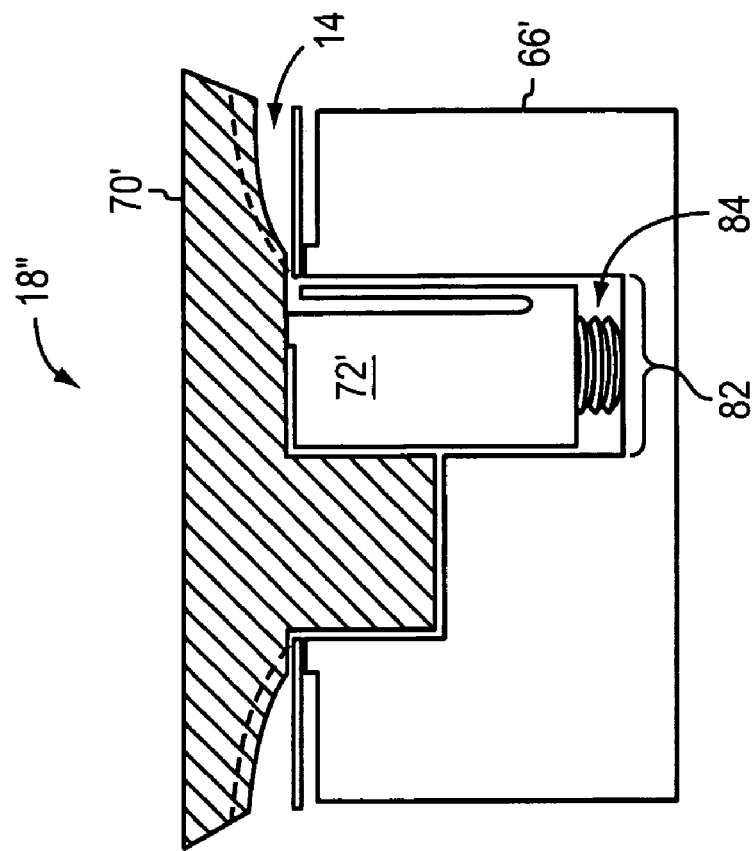
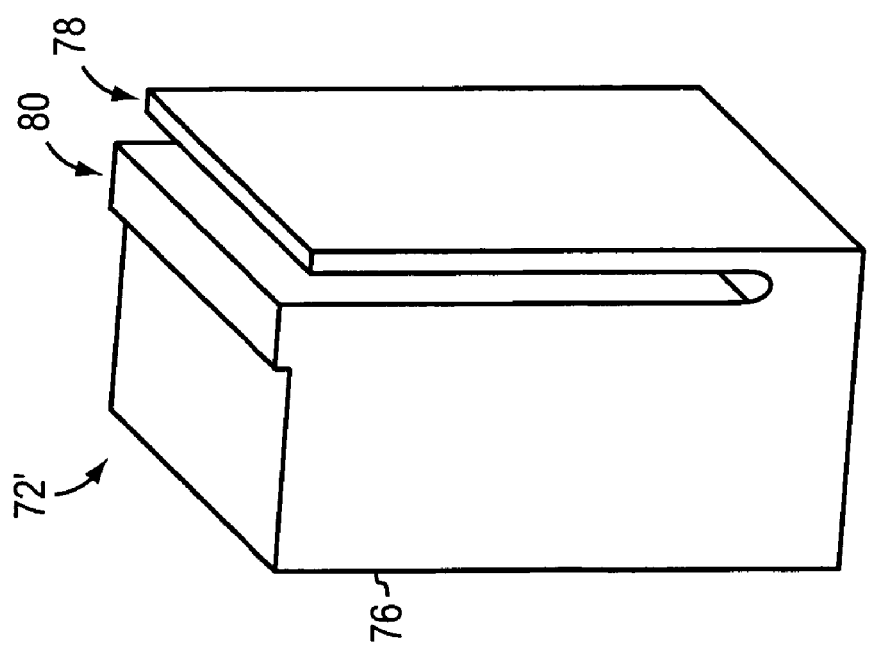

ULTRA-THIN WAFER HANDLING SYSTEM

FIELD OF THE INVENTION

The invention relates generally to the field of substrates for integrated circuits, and more particularly to methods and systems for holding, handling, and transporting ultra-thin wafers.

BACKGROUND OF THE INVENTION

As portable electronic devices, micro-electromechanical systems (MEMS), and smart cards become smaller and thinner, so too must the integrated circuits from which they are fabricated. Thin circuits not only consume less space, they also allow for more functionality per unit volume, increase power dissipation, and provide for a mechanically flexible device that may conform to curved surfaces. Thin circuits are typically fabricated on ultra-thin substrates, such as ultra-thin silicon wafers. Typical dimensions of ultra-thin wafers are about 60 µm to 80 µm, while the theoretical limit for suitable thin wafers is about 10 µm.

Bernoulli end effectors have been used in various applications to handle thin substrates. Bernoulli end effectors use a support member with fluid exhaust ports brought into close proximity with the top side of a substrate. The exhaust ports are configured so that the gas flow creates a low pressure region on the top side of the substrate causing it to lift up toward the support member. The substrate can be lifted from a substantially flat surface and transported from the top side of the substrate without contacting the top side. Contacting a semiconductor wafer during processing typically contaminates it, thus decreasing the yield from individual semiconductor wafers.

A disadvantage of many prior art Bernoulli end effectors is that they do not provide guides to position the substrate, and thus do not provide for high precision centering of the substrate. Another disadvantage is that the holding mechanism restricts the transport motion to paths within a horizontal plane or perpendicular to a horizontal plane.

Disadvantages of thin substrates include processing difficulties, such as cracking, bowing, or flexing during lifting, holding, handling, and transporting the substrates. Bernoulli end effectors can transfer thin substrates, but many substrate cassettes and assembly area tools cannot accommodate them. Further, a method for processing both sides of a substrate is desirable, but supinating or flipping a substrate is difficult.

SUMMARY OF THE INVENTION

The present invention features, at least in part an improved Bernoulli end effector for holding, handling, and transporting thin substrates. The end effector includes edge guides to aid in the positioning of the substrate and also includes friction pads that impede rotational and translational motion of the substrate lifted by the end effector. The friction pads may contact, for example, the outer 2 mm of the edge of the substrate. The friction pads permit the Bernoulli end effector to be translated and/or elevated at a greater rate of speed, while reducing the likelihood that holding, centering or anti-rotation forces will be compromised.

The present invention also provides an apparatus and method for supinating a substrate so that both surfaces of the substrate may be processed. The apparatus may include a Bernoulli end effector to deliver a substrate to a system of chucks, which may be rotatably mounted. The apparatus also may include a sensor to monitor the position of the substrate prior to being transferred.

The present invention also provides a substrate handling structure that prevents a thin substrate from bowing or flexing during processing, and also provides guides that prevent the thin substrate from moving or translating on the surface of the substrate handling structure. The guides prevent the substrate from moving, which improves the accuracy of the positioning of the substrate. This is particularly important if/when the substrate bows or flexes due to its thinness and/or stresses placed on the substrate.

Accordingly, in a first aspect, the invention provides a Bernoulli end effector including a support member defining at least one passage for directing a fluid at a substrate to apply a holding force and a drag force on the substrate; at least one edge guide in mechanical communication with the support member for contacting an edge of the substrate to oppose the drag force applied by the fluid; and at least one friction pad in mechanical communication with the support member for contacting a surface of the substrate to impede a rotational motion of the substrate. At least one friction pad may be attached to at least one edge guide. The end effector may include a first plurality of passages symmetrically arranged about an axis of the support member and a second plurality of passages asymmetrically arranged about the axis of the support member. The first plurality of passages may be arranged in a circular pattern for providing a Bernoulli force perpendicular to a surface of the substrate. The second plurality of passages may be arranged in an arc for providing the drag force on the substrate.

The Bernoulli end effector can include an angle between a direction defined by the passages and a surface of the support member. The angle may be between about twenty and thirty degrees. The friction pads can be disposed for contacting the substrate within 2 mm of an edge of the substrate. The friction pad may be an elastomer or alumina. The edge guides can be beveled. The holding force can be applied first and then the drag force may be applied after a delay (e.g., between about 100 ms and 250 ms).

In another aspect, the invention features a method for handling a substrate with a Bernoulli end effector. The method includes directing a fluid at the substrate to apply a holding force and a drag force to the substrate; applying a counter force to an edge of the substrate to oppose the drag force; and applying a frictional force to a surface of the substrate adjacent to the edge of the substrate to impede a rotational motion of the substrate. The holding force creates a low pressure Bernoulli force to lift the substrate. In one embodiment, the holding force is first applied and then the drag force is applied after a delay.

In still another aspect, the invention provides a method for handling a substrate with a Bernoulli end effector. The method includes directing a fluid at the substrate to apply a holding force to the substrate; applying a drag force after applying the holding force; and applying a counter force to an edge of the substrate to oppose the drag force. The method can include applying a frictional force to a surface of the substrate adjacent to the edge of the substrate to impede a rotational motion of the substrate.

In yet another aspect, the invention provides a substrate handling structure including a substrate carrier having a substrate support feature; a substrate clamp moveable between a lowered position for securing a substrate on the substrate support feature and a raised position to permit placing the substrate on the substrate support feature; and at least one guide disposed adjacent to the substrate support feature for impeding a lateral movement of the substrate when the substrate clamp is in the raised position. The at least one guide can be retractably mounted for retracting the at least one guide when the substrate clamp secures the substrate. The substrate clamp can be configured to cause the at least one guide to retract when the substrate clamp is moved from the raised position to the lowered position.

In one embodiment of the substrate handling structure, the substrate clamp is configured to cover only a surface portion adjacent to an edge of the substrate. The substrate clamp can include a beveled edge portion configured to contact the substrate and center the substrate on the substrate support feature. The guide can include a spring that urges the guide to project above a surface of the substrate carrier. The guide may be attached to the substrate carrier. The substrate carrier can define at least one cavity within which the at least one guide is moveably mounted. The guide can include a first portion and a second portion that is flexibly attached to the first portion, the second portion for contacting the substrate.

In still another aspect, the invention provides an apparatus for supinating a substrate. The apparatus includes a first substrate chuck for securing the substrate while a first surface of the substrate is exposed; a second substrate chuck spaced in opposition to the first substrate chuck for securing the substrate after receiving the substrate from the first substrate chuck to expose a second surface of the substrate; and an end effector for either delivering the substrate to the first substrate chuck or receiving the substrate from the second substrate chuck. In one embodiment, the end effector is rotatably mounted for rotating the substrate about an axis parallel to a face of the substrate or for rotating after delivering a substrate to the first or second substrate chuck. In another embodiment, the first chuck and the second chuck are each fixedly mounted. In various embodiments, the first chuck and the second chuck are mounted in a fixed relationship to each other, and together are rotatably mounted for rotating a substrate secured by one of the first and second chucks. At least one of the first and second chucks may be either a Bernoulli chuck or an electrostatic chuck. In various embodiments of the apparatus, the end effector is a Bernoulli end effector. The apparatus can include an actuator in mechanical communication with the first substrate chuck. The actuator controls the spacing between the first substrate chuck and the second substrate chuck. The apparatus also can include a sensor (e.g., a camera) for monitoring the position of the substrate. The sensor may be integrated with at least one of the chucks.

In another aspect, the invention provides a method for supinating a substrate. The method includes securing a substrate with a first substrate chuck such that a first surface of the substrate faces the first substrate chuck; transferring the substrate to a second substrate chuck that is spaced in opposition to the first substrate chuck such that a second surface of the substrate faces the second substrate chuck; and receiving the substrate from the second substrate chuck to expose the second surface of the substrate. The method can include transferring, by an end effector, the substrate to the first substrate chuck. The method also may include rotating a portion of the end effector after transferring the substrate to the first substrate chuck and before receiving the substrate by the end effector. In one embodiment, the method includes translating at least one of the first substrate chuck and the second substrate chuck to control the spacing between the chucks prior to transferring the substrate.

Other aspects and advantages of the invention will become apparent from the following drawings, detailed description, and claims, all of which illustrate the principles of the invention, by way of example only.

BRIEF DESCRIPTION OF THE DRAWINGS

The advantages of the invention described above, together with further advantages, may be better understood by referring to the following description taken in conjunction with the accompanying drawings. In the drawings, like reference characters generally refer to the same parts throughout the different views. The drawings are not necessarily to scale, emphasis instead generally being placed upon illustrating the principles of the invention.

FIG. 2A is a bottom view of an embodiment of a Bernoulli end effector according to the invention;

FIG. 2B is a cross-sectional view of the Bernoulli end effector shown in FIG. 2B;

FIG. 7A is a perspective view of an embodiment of a guide for a substrate, according to the invention; and FIG. 7B is a cross-sectional view of the guide of FIG. 7A disposed in an exemplary substrate handling structure.

DETAILED DESCRIPTION OF THE INVENTION

Figure 1:
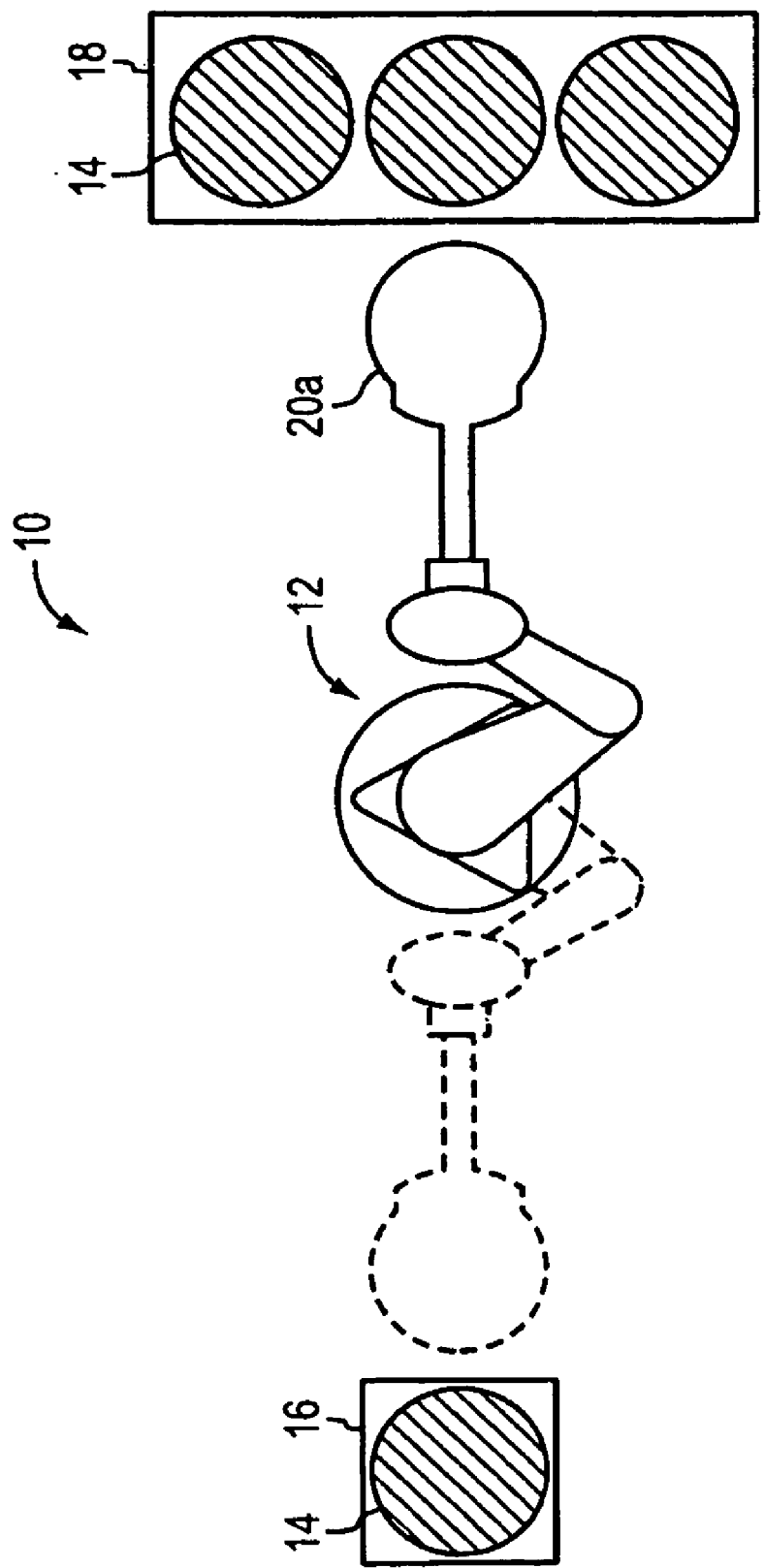
FIG. 1 is a top view of an embodiment of a substrate handling system.

FIG. 1 is a top view of an embodiment of a substrate handling system 10 that may benefit from features of the invention. Such a system 10 may be a component piece or tool of an in-line processing apparatus, e.g., described in U.S. Pat. No. 6,217,272 to Felsenthal et al. and U.S. Pat. No. 6,530,733 to Klein et al., the entire disclosures of which are hereby incorporated by reference. The system 10 includes a robot arm 12 that transports a substrate 14 or a batch of substrates 14 from a substrate carrier 16 and places them on a substrate handling structure 18 (e.g., a wafer tray or any type of substrate carrier known in the art). The substrates 14 may be, e.g., semiconductor wafers or glass substrates. The diameter of the substrates 14 may be, e.g., about 125 mm, about 150 mm, about 200 mm, about 250 mm, or about 300 mm. The thickness of the substrates 14 may be between about 10 µm and about 750 µm. Typical dimensions of an ultra-thin wafer are a diameter of about 150 mm and a thickness of about 80 µm, although, as will be described below, the features of the invention become more helpful as the diameter of the wafer becomes larger, and the thickness of the wafer becomes smaller.

The robot arm 12 may be any type known in the art, and is typically computer controlled. In one embodiment, the robot arm 12 is a rotatable multi-segmented arm that is positionable between a first position proximate to the substrate carrier 16 (as shown in dotted view) and a second position that is proximate to the substrate handling structure 18. The robot arm 12 is movable vertically to enable it to load and unload substrates from different vertical levels of the substrate carrier 16. The substrate handling structure 18 may be located in a load lock chamber, which transfers the substrates 14 from atmosphere to vacuum for processing.

Typically, the robot arm 12 includes an end effector 20*a* for lifting the substrates 14 from the substrate carrier 16 and transferring them to the substrate handling structure 18. In one embodiment, the end effector is a Bernoulli end effector. In another embodiment, the end effector is an electrostatic chuck, although vacuum end effectors and edge clamp end effectors may be used.

FIG. 2A depicts the bottom surface of an illustrative embodiment of a Bernoulli end effector 20*b* that may be used in the system 10. FIG. 2B shows a cross-sectional view of the Bernoulli end effector 20*b* of FIG. 2A. The Bernoulli end effector 20*b* includes a support member 22, a series of passages 24, an arm 26, at least one edge guide 28, and at least one friction pad 30.

Bernoulli end effectors are particularly useful for ultra-thin wafers because they not only lift the wafers, but they also hold the wafers flat. The Bernoulli end effectors are also advantageous because they can lift a wafer that has bowed or flexed while preventing the wafer from contacting the end effector. Larger diameter wafers and thinner wafers have a greater tendency to bow. For example, an ultra-thin wafer resting on a flat surface may bow or flex as much as 1 cm. By adjusting the distance between the wafer and the end effector prior to lifting or by adjusting the fluid flow rate, one can compensate for the bow or flex of the ultra-thin wafers. Features of the invention, such as the edge guides and friction pads, can be included on the Bernoulli end effector to improve positioning and centering of the wafers on the end effector and impede motion of the substrate while the end effector is being translated or rotated.

According to the illustrative embodiment, the support member 22 is fixedly attached to the arm 26. The arm 26 may be the robotic arm 12 shown in FIG. 1, or may be connectable to the robotic arm 12. In one embodiment, the support member 22 and the arm 26 are metal, although they need not be the same material. Suitable metals include, but are not limited to, aluminum, stainless steel, and titanium. The support member 22 and the arm 26 may also be a composite material or a metal alloy. According to the embodiment depicted in FIG. 2B, the support member 22 protrudes below the bottom surface of the arm 26. In an alternative embodiment, the support member 22 and the arm 26 are flush on the bottom surface. In yet another embodiment, the arm 26 protrudes below the support member 22.

According to the illustrative embodiment, the support member 22 has a series of passages 24 bored into it. The passages 24 direct a fluid at a substrate, e.g., an ultra-thin wafer (not shown), to apply a holding force and/or a drag force to the surface of the wafer. The drag force is a lateral force applied to the substrate 14 to push the wafer against the edge guides 28. The passages 24 may be bored by a drill, by Electrical Discharge Machining (EDM), or by laser drilling. The fluid can be a liquid or a gas. Suitable gases include, but are not limited to, dry nitrogen, air, argon, or helium. Typical flow rates can range from about five standard liters per minute (SLM) to about 20 SLM (the greater the flow rate, the greater the holding force applied to the wafer).

According to the illustrative embodiment, the cross-section of the passages 24 is circular. The cross-section also may be square, rectangular, elliptical, or oblong. The distance between the support member and the ultra-thin wafer prior to applying the holding force is typically about 2 mm to about 12 mm. In one embodiment, the distance is about 2 mm to about 3 mm, which prevents the wafer from being lifted too abruptly and crashing into the bottom surface of the support member 22 or the arm 26.

In one embodiment, the passages 24 are bored into the support member 22 at an angle relative to the surface of the support member. A typical angle is about 30°, although the angle may be between about 10° and about 40°. A shallow angle is preferred so that the fluid contacts the substrate at a glancing angle. This allows for the ultra-thin wafer to be in closer proximity to the bottom surface of the support member 22 and provides a greater holding force to the wafer. Shallow angles increase the amount of material that must be drilled to form the passage 24, and thus increases the cost of machining.

In one embodiment, the passages 24 can be between about 0.010 inch and 0.020 inch in diameter, and preferably between about 0.010 in and about 0.012 inch, although smaller diameter passages can be drilled. Like the angle of the passages, the smaller bores require a greater cost. In one embodiment, the angle would be as shallow as, the diameter would be as small as, and the spacing would be as close as the material and fabrication methods permit. This provides for the most efficient hold force, and minimize the probability of damaging the ultra-thin wafer.

The passages 24 can be arranged symmetrically around the central axis of the support member 22 or can be arranged asymmetrically. For example, as shown in FIG. 2A, a first series of passages is arranged around the central axis in a circular pattern 32. This pattern 32 delivers the hold force to the substrate, while a second series of passages arranged in an arc pattern 34 delivers the drag force. The fluid source for the circular pattern 32 and the arc pattern 34 may be separate, or may be the same. In an exemplary embodiment, forty passages are distributed around the circular pattern 32 with about a 9° spacing, and thirteen holes are distributed around the arc pattern 34 with about a 10° spacing.

In an alternative embodiment, a single series of passages 24 is arranged around the central axis in a circular pattern. The distribution of passages 24 is varied around the single circle such that the density of passages is greater in the region applying the drag force. In this embodiment, the passages 24 are fed by the same fluid source.

The edge guides 28 contact an edge of the ultra-thin wafer and oppose the drag force applied by the fluid. In various embodiments, the edge guides 28 are in mechanical communication with either the support member 22 or the arm 26. In an alternative embodiment, the edge guides 28 are distributed between the support member 22 and the arm 26. According to the illustrative embodiment, the edge guides 28 protrude below the bottom surface of the support member 22. In one embodiment, the edge guides 28 protrude about 1 mm below the surface of the support member 22. In another embodiment, the edge guides 28 protrude about 2 mm below the surface of the support member 22. In various embodiments, the edge guides 28 are ultra-high molecular weight polyethylene (UHMWPE). The edge guides 28 may contact the wafer with a flat edge or a curved edge. The width or diameter of the edge guides 28 may be between about 1 mm and about 6 mm. Preferably, the edge guides are cylindrical with a diameter of between about 3 mm and about 5 mm. In one embodiment, the edge guides 28 are beveled. If the wafer is slightly off-center, the beveled edge gently urges the wafer back on center. In one embodiment, there are between about two and about twenty edge guides, although more edge guides may be used. In one embodiment, fourteen edge guides are used.

According to the illustrative embodiment, the support member 22 includes friction pads 30 for contacting a surface of an ultra-thin wafer and/or impeding motion of the wafer. For example, when the end effector is translated horizontally, the friction pads 30 inhibit the wafer from sliding out of position. The friction pads 30 can reduce or preclude rotational motion of the wafer. The friction pads 30 can be attached to a edge guide 28. Alternatively, the friction pads 30 may be positioned between adjacent edge guides 28.

In one embodiment, the friction pads 30 contact the substrate within a 2 mm wide edge exclusion zone. Contact in this zone is permitted during processing because wafer devices are not typically placed in this region, and thus the wafer is not contaminated. The friction pads 30 may be formed from alumina or an elastomer, such as VITON® fluoroelastomer and KALREZ® perfluoroelastomer (available from DuPont Dow Elastomer, LLC). The friction pads 30 may be circular, square, rectangular, or oblong. In various embodiments, the friction pads are between about 1 mm$^2$ and about 2 mm$^2$. In one embodiment, the friction pads are about 1×1.75 mm. In another embodiment, the friction pads are about 1×1 mm.

In various embodiments, the Bernoulli end effector 20b includes a sensor, e.g., a camera or other sensor known in the art. The sensor monitors the performance characteristics of the end effector, including, but not limited to, fluid pressure and fluid flow rate. The sensor may also monitor the substrate characteristics, such as position, orientation, or simply just the presence of a substrate. The sensor may be in mechanical communication with or close proximity to the Bernoulli end effector 20b.

In one embodiment of the Bernoulli end effector 20b, the hold force and the drag force are applied simultaneously to the ultra-thin wafer to lift the wafer and urge an edge of the wafer into contact with the edge guides 28. In an alternative embodiment, where the fluid source for the patterns of passages 32 and 34 are separate, the hold force and the drag force can be applied separately. When working with ultra-thin wafers, if the hold force and the drag force are applied simultaneously, the possibility exists that the wafer can be pulled toward the edge guides before the hold force has provided adequate lift. This may result in the ultra-thin wafer being lifted up into the bottom surface of a edge guide, and possibly damaging the wafer. To prevent this, the hold force can be applied first, and then the drag force is applied after a short delay. Typical delays are between about 100 ms to about 250 ms.

Figure 3:
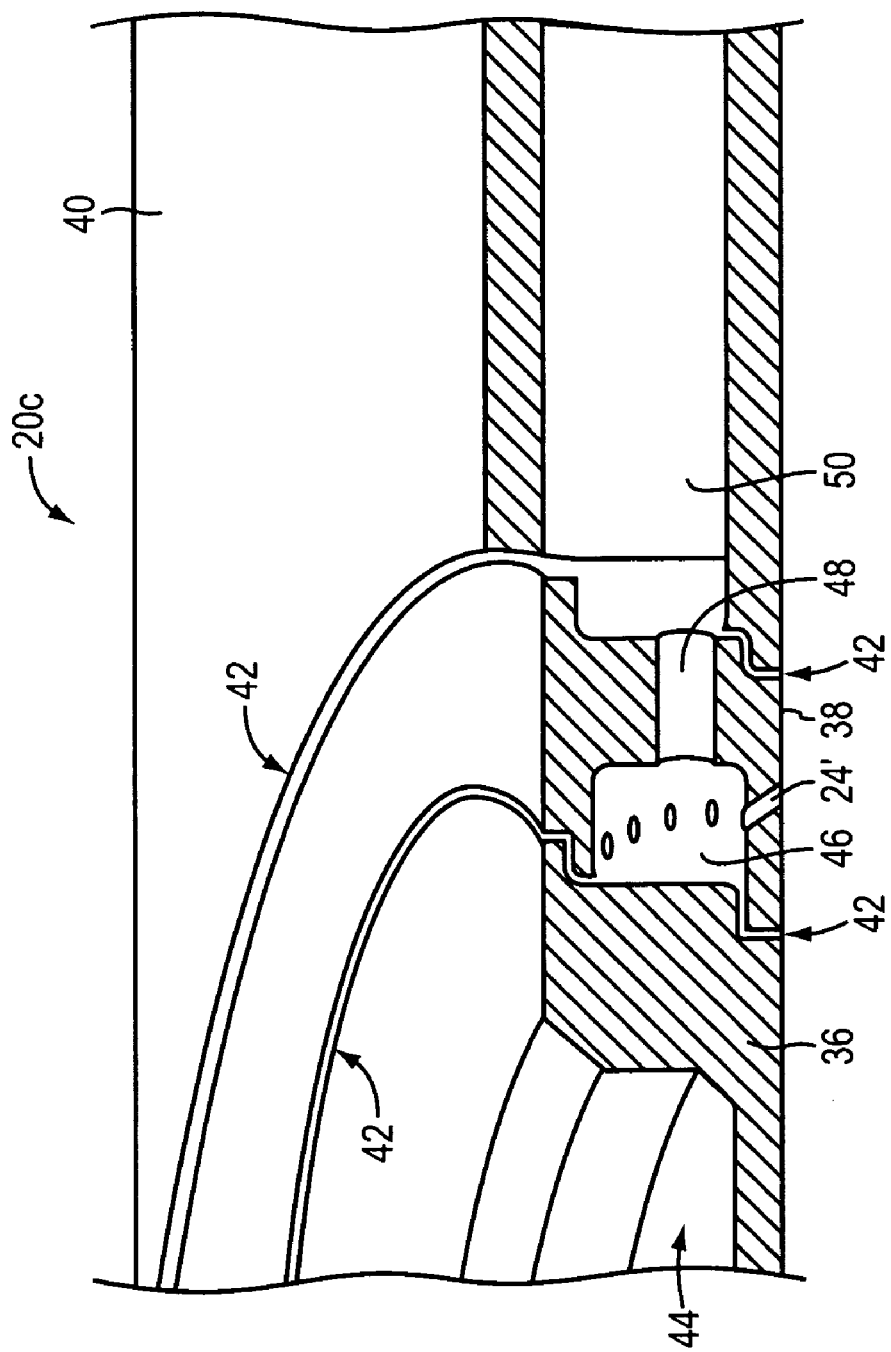
FIG. 3 is a sectional elevation of an exemplary Bernoulli end effector according to the invention.

FIG. 3 depicts a section of an exemplary Bernoulli end effector 20c formed from component pieces. The end effector 20c includes a cap ring 36, a nozzle ring 38, and an arm 40. The component pieces may be epoxied at points of intersection 42 to prevent fluid from escaping the end effector 20c. The cap ring 36 may include a cavity 44 to decrease its weight. The nozzle ring 38 includes a plurality of passages 24' that deliver fluid to the surface of a substrate (not shown). A cavity 46 is defined by the cap ring 36 and the nozzle ring 38, and the plurality of passages 24' are connected to the cavity 46, which assists in the delivery of the fluid to the passages 24'. The nozzle ring 38 also includes a fluid passage 48 to connect the cavity 46 to a fluid channel 50 in the arm 40. The fluid passage 48 can be, for example, about 0.047 inch diameter. The fluid channel 50 directs fluid from a fluid source (not shown) to the passages 24'. In one embodiment, the fluid channel 50 is formed by milling a trough in the arm 40, and then affixing a thin piece of metal, e.g., a 0.01 inch stainless steel ribbon, along the length of the fluid channel 50 to seal it.

Figure 4:
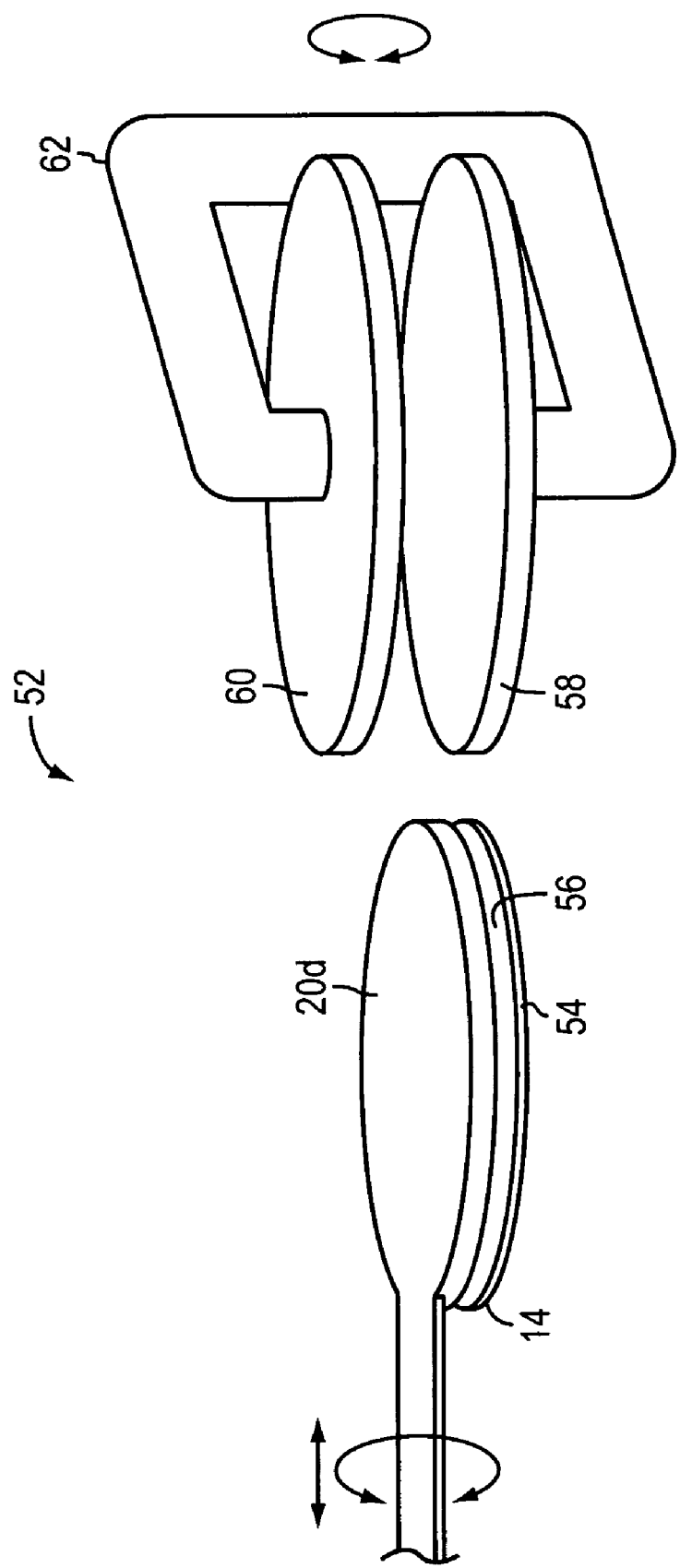
FIG. 4 is a perspective view of an embodiment of a system for supinating a substrate, according to the invention.

FIG. 4 depicts an illustrative embodiment of an apparatus 52 for supinating a substrate 14 having a first surface 54 and a second surface 56. The apparatus 52 includes an end effector 20d, and a first substrate chuck 58 and a second substrate chuck 60 attached to a mount 62. During semiconductor wafer processing, an ultra-thin wafer may be supinated so that both sides of the wafer can be processed. For example, flipping the wafer permits further processing of the underside, such as metallization.

To supinate an ultra-thin wafer, the two opposing chucks 58 and 60 are aligned, as described in more detail below. The end effector 20d has the ability to translate in the horizontal plane or rotate about its longitudinal axis. The end effector 20d may deliver the substrate 14 to the first chuck 58, and then rotate 180° about its longitudinal axis to receive the substrate from the second substrate chuck 60. Alternatively, the mount 62 may have the ability to rotate about an axis parallel to the plane of the substrate chucks 58 and 60. The end effector 20d then receives the substrate 14 from the second susbtrate chuck 60 after the substrate 14 is transferred between chucks.

According to the illustrative embodiment, the end effector 20d delivers to the first substrate chuck 58 the substrate 14 with the first surface 54 exposed. The second substrate chuck 60 is spaced in opposition to the first substrate chuck 58, and provides sufficient space for the end effector 20d to place the substrate 14 without contacting either chuck 58 or 60. Either the first chuck 58 or the second chuck 60 may be mounted on an actuator, so that the distance between the chucks 58 and 60 can be controlled prior to transferring the substrate 14. The distance between the chucks 58 and 60 may be between about 1 mm and about 12 mm during transfer, although a smaller distance (about 1 mm to about 2 mm) is preferred so that an ultra-thin wafer is not damaged.

Transfer of the substrate 14 is accomplished by substantially simultaneously turning off the first substrate chuck 58 and turning on the second substrate chuck 60. The second substrate chuck 60 receives the substrate 14 from the first substrate chuck 58, thereby exposing the first surface 54 of the substrate 14. The end effector 20d is then positioned to receive the substrate 14 from the second substrate chuck 60 after the substrate 14 is flipped.

In one embodiment, the apparatus 52 includes a sensor and/or electronics to determine the position or orientation of the substrate 14 prior to, during, and/or after supination. If the sensor determines that the substrate 14 is not positioned correctly, it may rotate either the first chuck 58 or the second chuck 60, so that the position will be corrected. The sensor may be a camera or other sensor known in the art. The sensor may be attached to either the first chuck 58 or the second chuck 60.

In one embodiment, the end effector 20d may be attached to a robotic arm that supinates the end effector 20d prior to receiving the substrate 14 from the second substrate chuck 60. After receiving the substrate 14, the end effector 20d may be inverted a second time so that the second surface 56 of the substrate 14 faces downward. In an alternative embodiment, the mount 62 is rotatable, so that the substrate 14 may be supinated while being lifted by one of the two substrate chucks 58 and 60.

Either of the two substrate chucks 58 and 60 may be either a Bernoulli chuck or an electrostatic chuck. The end effector 20d may be a Bernoulli end effector, such as the Bernoulli end effectors 20b or 20c described above. As described above, Bernoulli end effectors and chucks are particularly advantageous for ultra-thin semiconductor wafers because they provide a contact free lifting device and because they hold the wafers flat.

Figure 5:
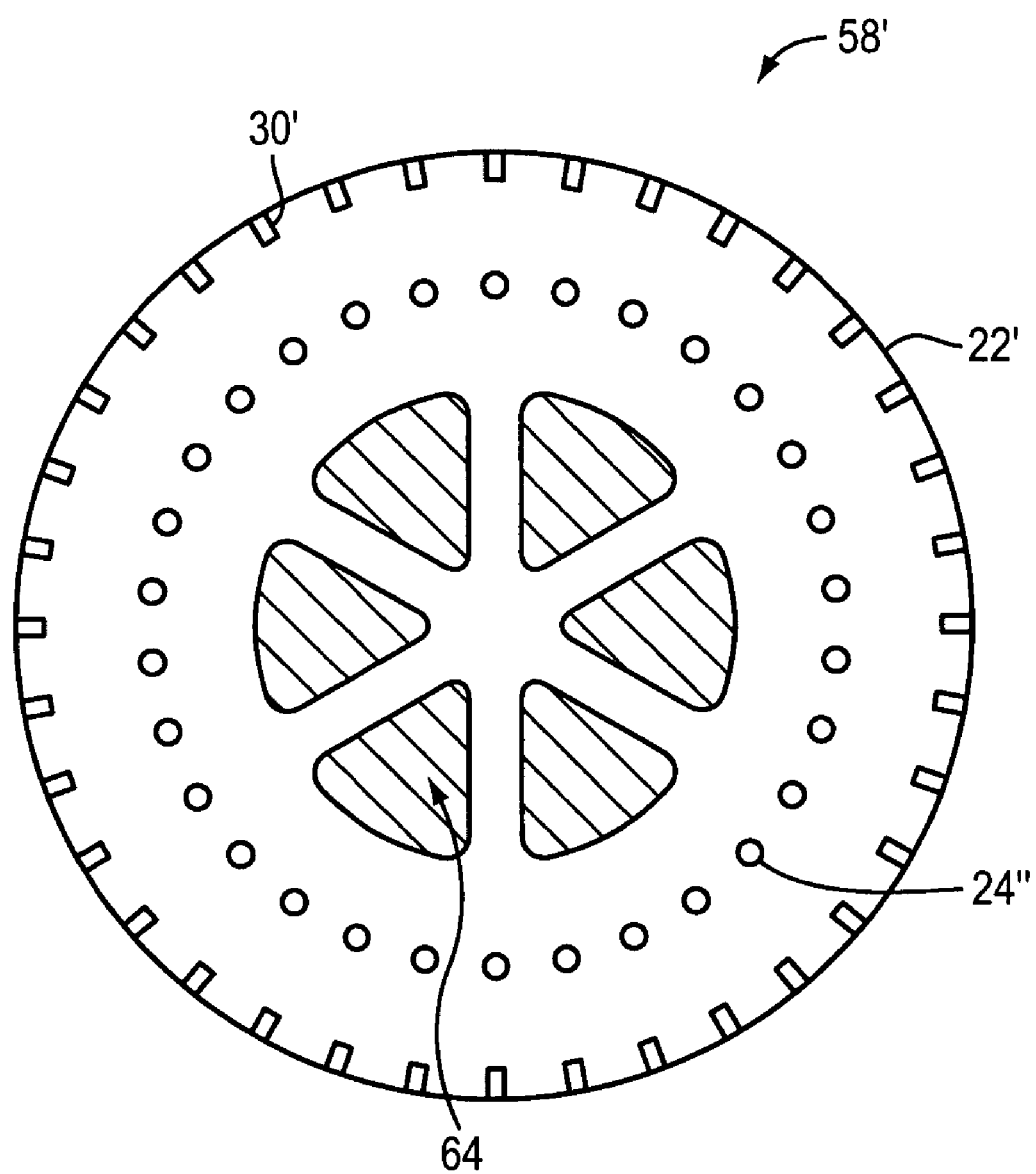
FIG. 5 is a top view of an embodiment of a Bernoulli chuck for use with the system depicted in FIG. 4.

FIG. 5 depicts an illustrative embodiment of a Bernoulli chuck 58' for use with the apparatus 52 depicted in FIG. 4.

The chuck 58' includes a support member 22', a series of passages 24" for delivering a fluid to a substrate, friction pads 30', and cut-outs 64 in the support member 22'. In this embodiment, the passages are located closer to the perimeter of the support member 22' than, for example, in the Bernoulli end effectors described above. Having the passages closer to the edge of the Bernoulli chuck 58' provides a holding force closer to the edge of the wafer, which reduces the possibility of distortion of an ultra-thin wafer and, in particular, larger diameter wafers. In the illustrative embodiment, the friction pads 30' are positioned around the entire perimeter of the support member 22' to provide additional resistance to rotational or translational motion of the wafer when it is supinated. The cut-outs 64 reduce the weight of the support member 22'.

Figure 6:
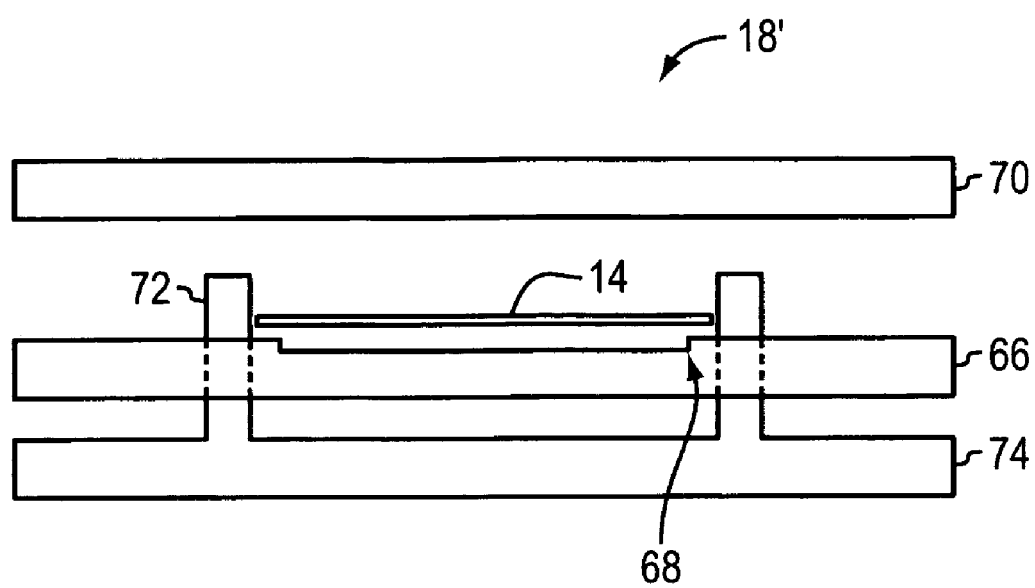
FIG. 6 is a cross-sectional view of an exemplary substrate handling structure according to the invention.

FIG. 6 shows a cross-sectional view of an exemplary substrate handling structure 18' according to the invention. The structure 18' includes a substrate carrier 66, a substrate support feature 68, a substrate clamp 70, at least one guide 72, and a secondary base 74. The substrate 14 is placed on the substrate support feature 68 of the substrate carrier 66. The substrate clamp 70 holds the substrate 14 flat during processing of the substrate 14. After processing, the substrate 14, and particularly ultra-thin wafers, are more susceptible to curling, bowing or flexing due to stress applied, e.g., by a film deposited. The substrate clamp 70 also maintains the shape of the substrate 14 until an end effector can remove the substrate from the substrate carrier 66. The substrate clamp 70 is moveable between a lowered position for securing the substrate 14 and a raised position, which permits the substrate 14 to be placed or retrieved, e.g., by one of the end effectors 20a, 20b, 20c, or 20d.

Because the substrates are so thin, they may be analogized to a piece of paper resting on a table. The slightest displacement of air may cause the substrate to move. The guides 72 impede lateral movement of the substrate 14 when the substrate clamp 70 is in the raised position. When the substrate clamp 70 is lowered, the guides 72 may retract below the surface of the substrate carrier 66. The guides 72 may be attached to the substrate carrier 66 or to the secondary base 74. The guides 72 also may serve as pins that raise or lower the substrate clamp when the guides 72 are actuated. In an alternative embodiment, the guides 72 may be spring loaded, so that they pop-up when the substrate clamp 70 is raised. In this embodiment, the guide may be located in a recess or cavity in the substrate carrier.

In one embodiment, the substrate clamp 70 is constructed to only cover the edge of the substrate 14. The substrate clamp 70 may have a beveled edge. The substrate clamp 70 may contact the edge of the wafer as the substrate clamp 70 is lowered. If the ultra-thin wafer is not centered on the substrate support feature 68, the beveled edge will gently nudge the wafer toward the center of the support feature 68 as the substrate clamp 70 is lowered.

In addition, the substrate clamp 70 may be constructed in sections. For example, if multiple sections are used, then one section may be raised to expose between about 25% and about 40% of the edge of an ultra-thin wafer. The wafer remains flat until the Bernoulli end effector can be introduced to lift the wafer from the carrier.

FIG. 7A shows an exemplary guide 72' for impeding lateral movement of a substrate (not shown). The guide 72' includes a rigid portion 76, a flexible portion 78, and a ridge 80. The rigid portion 76 forms the body of the guide 72'. The flexible portion 78 contacts the edge of the substrate. It provides a pliant surface that minimizes the stress applied to the edge of an ultra-thin wafer. The ridge 80 is disposed to contact the substrate clamp (not shown), thereby preventing the substrate clamp from contacting the more fragile flexible portion 78. In one embodiment, the rigid portion 76 and the flexible portion 78 are metal, although they need not be the same material. Suitable metals include, but are not limited to, aluminum, stainless steel, and titanium. The portions 76 and 78 also may be a composite material or a metal alloy.

FIG. 7B depicts a cross-sectional view of the guide 72' placed in a recess 82 formed in the substrate carrier 66' of an exemplary substrate handling structure 18". As described above, the structure 18" includes a substrate clamp 70' for holding the substrate 14 flat before, during, and after processing. The substrate clamp 70', when lowered, forces the guide 72' into the recess 82. When the substrate clamp 70' is raised, a spring 84 forces the guide 72' up, and the flexible portion of the guide 72' contacts the substrate 14.

While the invention has been particularly shown and described with reference to specific illustrative embodiments, it should be understood that various changes in form and detail may be made without departing from the spirit and scope of the invention as defined by the appended claims.

What is claimed is:

1. A Bernoulli end effector comprising:
   a support member defining at least one passage for directing a fluid at a substrate to apply a holding force and a drag force on the substrate, wherein the hold force is first applied and the drag force is applied after a delay of between about 100 ms and 250 ms;
   at least one edge guide protruding from a first surface of the support member for contacting an edge of the substrate to oppose the drag force applied by the fluid; and
   at least one friction pad attached to the first surface of the support member for contacting a surface of the substrate to impede a rotational motion of the substrate.

2. A method for handling a substrate with a Bernoulli end effector, the method comprising:
   directing a fluid at the substrate to apply a holding force and a drag force to the substrate, the holding force creating a low pressure Bernoulli force to lift the substrate, wherein the hold force is first applied and the drag force is applied after a delay;
   applying a counter force to an edge of the substrate to oppose the drag force; and
   applying a frictional force to a surface of the substrate adjacent to the edge of the substrate to impede a rotational motion of the substrate.

3. The method of claim 2, wherein the delay is between about 100 ms and 250 ms.

4. A method for handling a substrate with a Bernoulli end effector, the method comprising:
   directing a fluid at the substrate to apply a holding force to the substrate, the holding force creating a low pressure Bernoulli force to lift the substrate;
   applying a drag force after applying the holding force; and
   applying a counter force to an edge of the substrate to oppose the drag force.

5. The method of claim 4, wherein the drag force is applied between about 100 ms and 250 ms after the holding force is applied.

6. The method of claim 4, further comprising applying a frictional force to a surface of the substrate adjacent to the edge of the substrate to impede a rotational motion of the substrate.

7. A Bernoulli end effector comprising:
means for directing a fluid at a substrate to apply a hold force and a drag force to the substrate, the holding force creating a low pressure Bernoulli force to lift the substrate;
means for first applying the hold force and then applying the drag force;
means for applying a counter force to an edge of the substrate to oppose the drag force; and
means for applying a frictional force to a surface of the substrate adjacent to the edge of the substrate to impede a rotational motion of the substrate.

8. The method of claim 2 further comprising contacting the edge of the substrate with an edge guide of the Bernoulli end effector to apply the counter force.

9. The method of claim 2 further comprising using a friction pad of the Bernoulli end effector to apply the frictional force.

10. The method of claim 2 further comprising using a first plurality of passages symmetrically arranged about an axis of a support member of the Bernoulli end effector to apply the hold force.

11. The method of claim 2 further comprising using a second plurality of passages asymmetrically arranged about an axis of a support member of the Bernoulli end effector to apply the drag force.

12. The method of claim 2 further comprising contacting the substrate within 2 mm of the edge of the substrate using a friction pad of the Bernoulli end effector to apply the frictional force.

13. The method of claim 2 further comprising:
delivering the substrate using the Bernoulli end effector to a first substrate chuck; and
receiving the substrate using the Bernoulli end effector from a second substrate chuck to which the substrate is transferred.

14. The method of claim 4 further comprising contacting the edge of the substrate with an edge guide of the Bernoulli end effector to apply the counter force.

15. The method of claim 4 further comprising using a first plurality of passages symmetrically arranged about an axis of a support member of the Bernoulli end effector to apply the hold force.

16. The method of claim 4 further comprising using a second plurality of passages asymmetrically arranged about an axis of a support member of the Bernoulli end effector to apply the drag force.

17. The method of claim 6 further comprising contacting the substrate within 2 mm of the edge of the substrate using a friction pad of the Bernoulli end effector to apply the frictional force.

18. The method of claim 4 further comprising:
delivering the substrate using the Bernoulli end effector to a first substrate chuck; and
receiving the substrate using the Bernoulli end effector from a second substrate chuck to which the substrate is transferred.

19. The method of claim 6 further comprising using a friction pad of the Bernoulli end effector to apply the frictional force.

20. The Bernoulli end effector of claim 7 wherein the means for directing the fluid at the substrate comprises a support member defining a first plurality of passages symmetrically arranged about an axis of the support member to apply the hold force.

21. The Bernoulli end effector of claim 7 wherein the means for directing the fluid at the substrate comprises a support member defining a second plurality of passages asymmetrically arranged about an axis of the support member to apply the drag force.

22. The Bernoulli end effector of claim 7 wherein the means for applying the counter force comprises at least one edge guide attached to a first surface of the support member.

23. The Bernoulli end effector of claim 7 wherein the means for applying the frictional force comprises at least one friction pad attached to a first surface of the support member.

24. The Bernoulli end effector of claim 20 wherein the first plurality of passages are arranged in a circular pattern for providing a Bernoulli force perpendicular to a surface of the substrate.

25. The Bernoulli end effector of claim 21 wherein the second plurality of passages are arranged in an arc for providing the drag force on the substrate.

26. The Bernoulli end effector of claim 19 wherein the at least one friction pad contacts the substrate within 2 mm of an edge of the substrate.

27. The Bernoulli end effector of claim 26 wherein the at least one friction pad comprises an elastomer.

28. The Bernoulli end effector of claim 26 wherein the at least one friction pad comprises alumina.

29. The Bernoulli end effector of claim 7 wherein the means for first applying the hold force and then applying the drag force is adapted to apply the drag force after a delay of between about 100 ms and 250 ms.

30. The Bernoulli end effector of claim 1 wherein the at least one passage comprises a first plurality of passages symmetrically arranged about an axis of the support member and a second plurality of passages asymmetrically arranged about the axis of the support member.

31. The Bernoulli end effector of claim 30 wherein the first plurality of passages are arranged in a circular pattern for providing a Bernoulli force perpendicular to a surface of the substrate.

32. The Bernoulli end effector of claim 30 wherein the second plurality of passages are arranged in an arc for providing the drag force on the substrate.

33. The Bernoulli end effector of claim 1 wherein an angle between a direction defined by the at least one passage and a surface of the support member is at least approximately thirty degrees.

34. The Bernoulli end effector of claim 1 wherein the at least one friction pad contacts the substrate within 2 mm of an edge of the substrate.

35. The Bernoulli end effector of claim 1 wherein the at least one friction pad comprises an elastomer.

36. The Bernoulli end effector of claim 1 wherein the at least one friction pad comprises alumina.

37. The Bernoulli end effector of claim 1 wherein the at least one edge guide is beveled.

* * * * *